United States Patent [19]

Sakiya

[11] 4,416,213
[45] Nov. 22, 1983

[54] ROTARY COATING APPARATUS
[75] Inventor: Fumio Sakiya, Ibara, Japan
[73] Assignee: Tazmo Co., Ltd., Japan
[21] Appl. No.: 347,220
[22] Filed: Feb. 9, 1982
[30] Foreign Application Priority Data Feb. 14, 1981 [JP] Japan ................................ 56-20318

[51] Int. Cl.³ ....................... B05C 11/08; B05C 13/02
[52] U.S. Cl. ...................................... 118/52; 118/302; 118/321
[58] Field of Search ...................... 118/52, 53, 54, 321, 118/302, 326; 427/240

[56] References Cited
U.S. PATENT DOCUMENTS 2,028,355  1/1936  Russi .................................... 118/302
2,336,042 12/1943  Smith ................................ 118/302 X
3,524,427  8/1970  Glovatsky ............................ 118/302
4,190,015  2/1980  Hillman ........................... 427/240 X
4,347,302  8/1982  Gotman ........................... 427/240 X Primary Examiner—John P. McIntosh
Attorney, Agent, or Firm—William A. Drucker

[57] ABSTRACT

The present invention relates to a rotary coating apparatus wherein liquid to be applied (diffusion agent, photo resist, and others) is dropped through a nozzle on a rotating glass plate or semiconductor wafer seated on top of a spindle to form coatings over their surfaces and a cap is fitted on the lower surface of the nozzle when not in use to provide sealing so that the space enclosed with said nozzle and said cap is filled with solvent vapor.

4 Claims, 4 Drawing Figures

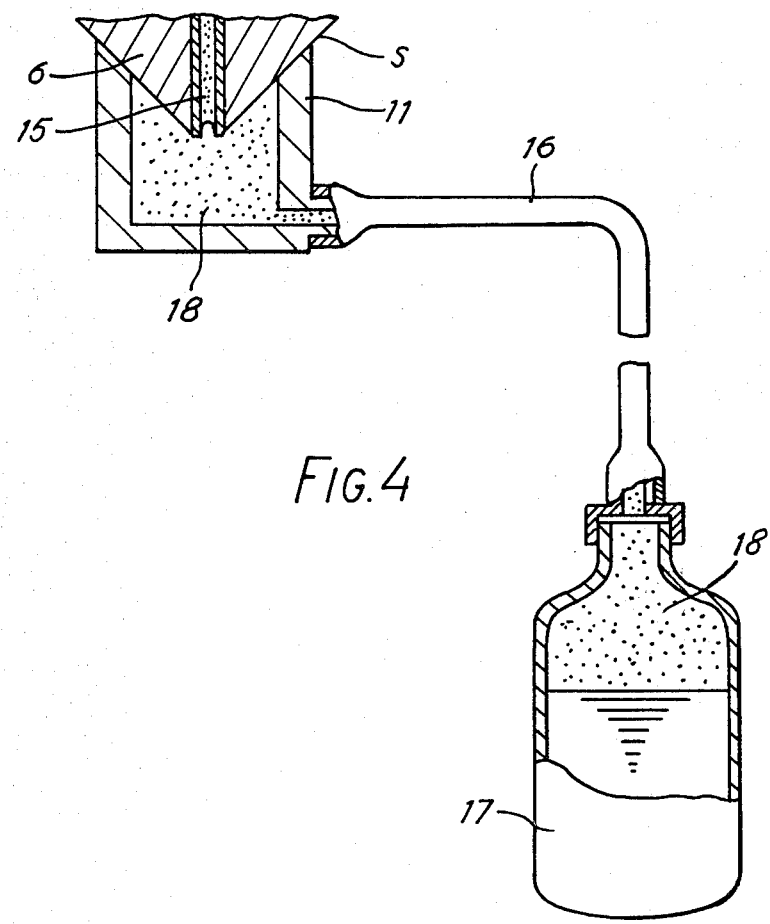

ROTARY COATING APPARATUS

BACKGROUND OF THE INVENTION

In the manufacturing process of semiconductor integrated circuits said rotary coating apparatus is used to drop diffusion agent or photo resist on semiconductor wafers and form their uniform coatings thereon utilizing a centrifugal force.

In said rotary coating apparatus liquid to be applied is dropped around the center of the surface of a semiconductor wafer (hereinafter called a substrate) held by attraction on top of the disc of a spindle, with said spindle stopped, then said spindle is rotated to spread the liquid all over the substrate and at same time scatter unnecessary liquid out thereof due to the centrifugal force, thereby providing uniform diffusion agent or photo resist film over the surface of said substrate.

By the way, during the time required from just after forming a film over a substrate by spindle rotation to just before making dropping on the succeeding substrate, or between the dropping operations e.g. because of changes in applying conditions some solvent contained by liquid in contact with air will diffuse at the lower surface of said nozzle, causing a change in liquid viscosity.

The slightest change in said viscosity will exert a great influence on film thickness in the formation of coatings by means of spindle rotation; in the case of diffusion agent it will result in the dispersion of diffusion density; for photo resist, uneven film thickness will cause the internal distortion of exposure to photo resist, thus leading to inaccurate exposure and therefore it will become extremely difficult to obtain high-accuracy micropatterns.

Hitherto, any countermeasures have not been proposed to solve said problems.

OBJECTS OF THE PRESENT INVENTION

An object of the present invention is to prevent solvent contained by liquid from volatilizing at a nozzle tip by fitting a cap on the lower surface of said nozzle when not in use to fill the internal space with solvent vapor.

A further object of the invention is to provide uniform coatings all over substrates by eliminating viscosity change of liquid to be applied, thereby contributing to quality improvements.

A still further object of the invention is to permit smooth and efficient operations for the automatic and continuous formation of coatings.

These and other objects of the present invention may become clearer with reference to the following detailed descriptions.

BRIEF DESCRIPTION OF THE DRAWINGS

FIG. 3 illustrates the sectional details of said capped nozzle.

FIG. 4 illustrates another example of preventing solvent from volatilizing with said nozzle capped.

DESCRIPTION OF THE PREFERRED EMBODIMENT

Figure 1:
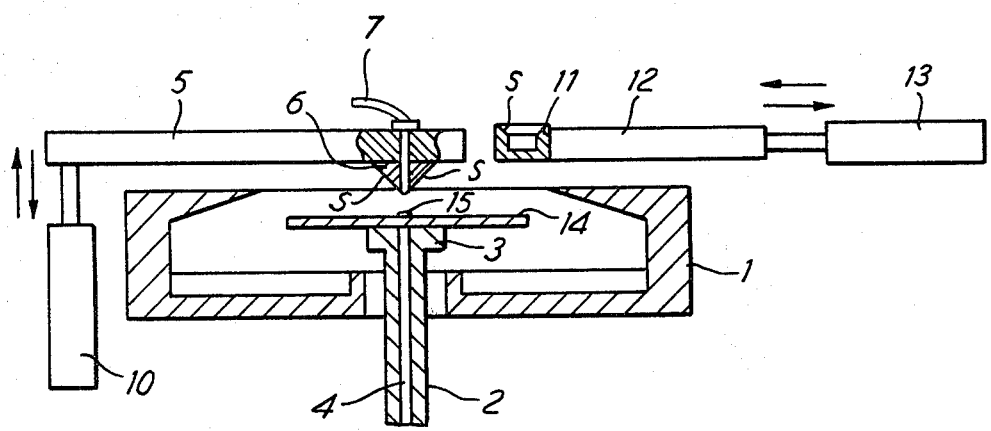
FIG. 1 illustrates the dropping operation of liquid on a semiconductor wafer.

A saucer designated as numeral 1 is secured to the body frame of said apparatus not illustrated herein and can accommodate scattered liquid during the coating formation to be described later. A spindle 2 driven and rotated by a motor mounted on the frame of said apparatus runs through the center of the saucer 1 and has an integrated seat 3 for a substrate at the upper end and a through hole 4 for vacuum attraction along the core.

At the bottom of one end of a horizontal support bar 5 which corresponds to the center of the substrate seat 3 of the spindle 2 is a nozzle 6 which is so arranged that liquid is supplied through a pipe 7 led from the side of the support bar 5. The operation of a cylinder 10 attached to the other end of the support 5 enables it to go up and down through a given distance, correspondingly causing the nozzle 6 to rise and lower the same distance just above the seat 3.

A cap 11 comprising a cylindrical container with the open end upward and the wall top inclined as much as the inclined wall S of the nozzle 6 (See FIG. 3) fits on the lower surface thereof. A support bar 12 holding the cap 11 is activated by a cylinder 13 to travel in and out horizontally between said nozzle 6 and said seat 3 in the saucer 1.

In operation, a substrate 14 is vacuum-attracted on the seat 3 through the hole 4, and the contraction of a cylinder 10 causes the nozzle 6 via the support 5 to lower near the substrate 14 and start dropping; at the termination of dropping the nozzle 6 rises to the upper limit as the cylinder 10 extends. Simultaneously a cylinder 13 extend until the cap 11 shifts up to the bottom of the nozzle 6 and with the opening of an air supply port at each end of the air cylinder 10 the nozzle 6 goes down by weight of the support 5, thereby covering its lower surface with a cap.

For the next dropping procedure, the cylinder 10 first extends and at the same time the nozzle 6 moves to the upper limit before the retraction of the cylinder 13 to remove the cap 11 from the nozzle 6, then said cylinder 10 contracts to make the nozzle 6 go down to the lower limit and start dropping.

The repetition of the above procedures permits the dropping of liquid of constant viscosity regardless of varying dropping intervals and hence provides uniform coatings. In the present invention the nozzle 6 which can shift vertically has permitted droppings made just above and near a substrate 14, thereby reducing solvent volatilization at the time of dropping and enabling the formation of uniform coatings of diffusion agent containing a solvent of large volatility such as alcohol.

It is advisable to put solvent 16 in the cap 11 beforehand so that, when the cap 11 fits on the lower surface of said nozzle, the internal space is kept in effective solvent vapor atmosphere. This is shown in FIG. 3: when the nozzle tip is covered with the cap 11, the space enclosed with said nozzle and said cap gets gradually filled with solvent volatilizing from the liquid until the saturation is reached, thereby preventing viscosity change.

It may be also a good example to lead solvent vapor 18 into the space via a hose 16 from a separate solvent container 17 with the nozzle 6 capped as shown in FIG. 4.

Figure 2:
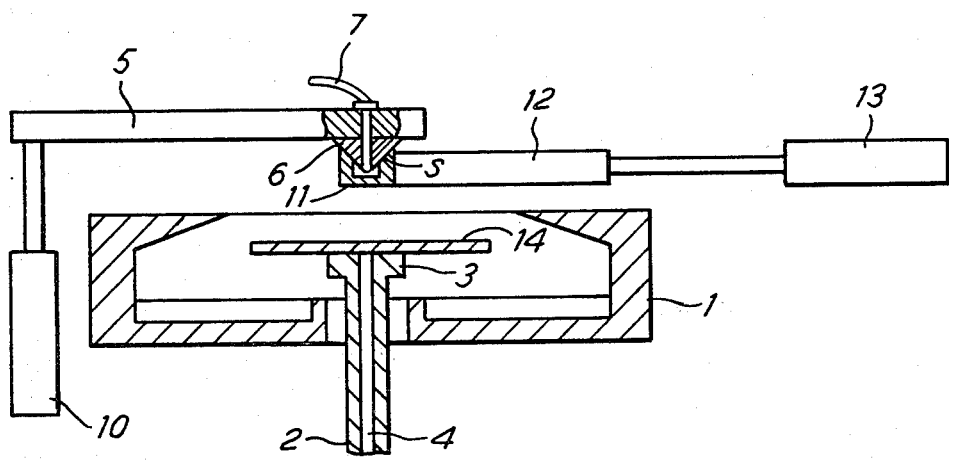
FIG. 2 illustrates the prevention of solvent from volatilizing with said nozzle capped at the bottom.

The inventor made experiments on semiconductor wafers by following the procedures as illustrated in FIGS. 1 and 2 to apply diffusion agent containing alcoholic solvent and using the cap 11 of volatilization prevention construction as shown in FIGS. 3 and 4. As a result, no viscosity change was found at the nozzle tip even after twelve hours had passed between the two succeeding dropping operations and uniform coatings were always provided, while in the conventional method using no cap, viscosity change was produced around the nozzle in two minutes between droppings.

As described above, the present invention can reduce solvent volatilization and hence eliminate sectional change in viscosity and lend itself to forming even coatings regardless of varying dropping intervals; for diffusion agent the apparatus disclosed by the invention can always provide its even film, thus eliminating the dispersion of diffusion density and enabling the manufacturing of semiconductors of uniform characters; in the case of photo resist it can provide uniform photo resist coatings and has proven to be prominently effective particularly when micropatterns are desired.

Furthermore, the present invention has proved to be effective not only with semiconductor wafers but also with other substrates such as glass masks and other metal plates.

I claim:

1. A rotary coating apparatus comprising:
   (a) a nozzle for depositing a coating liquid,
   (b) a first cylinder for moving said nozzle in a vertical direction for a predetermined distance,
   (c) a cap normally covering the underside of said nozzle,
   (d) a second cylinder for horizontally shifting said cap relative to said nozzle to remove said cap from said nozzle for depositing said coating liquid, and
   (e) a rotatable substrate support means for supporting a substrate adjacent said nozzle, said first cylinder lowering said nozzle to just above the surface of said substrate.

2. An apparatus as claimed in claim 1 wherein said cap has an open top, said normally open top fitting on the lower surface of said nozzle and a solvent in said cap.

3. An apparatus as claimed in claim 1, further including a separate container of solvent, and a hose for conducting solvent vapor into said cap from said container.

4. An apparatus as claimed in claim 1 wherein said nozzle is sealed by said cap except when it goes down and drops liquid on a substrate held in said seat.

* * * * *